(12) United States Patent
Tschanz et al.

(10) Patent No.: US 7,015,741 B2
(45) Date of Patent: Mar. 21, 2006

(54) ADAPTIVE BODY BIAS FOR CLOCK SKEW COMPENSATION

(75) Inventors: James W. Tschanz, Portland, OR (US); Nasser Kurd, Hillsboro, OR (US); Siva G. Narendra, Portland, OR (US); Javed Barkatullah, Portland, OR (US); Vivek K. De, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/745,029

(22) Filed: Dec. 23, 2003

(65) Prior Publication Data
US 2005/0134361 A1    Jun. 23, 2005

(51) Int. Cl.
*G05F 1/04*    (2006.01)
*H03K 3/00*    (2006.01)

(52) U.S. Cl. ...................... 327/295; 327/293
(58) Field of Classification Search ........ 327/534–535, 327/291–293, 295, 158
See application file for complete search history.

(56) References Cited

U.S. PATENT DOCUMENTS 5,880,612 A * 3/1999 Kim ......................... 327/158
6,097,113 A * 8/2000 Teraoka et al. ............. 307/125
6,323,714 B1 * 11/2001 Naffziger et al. ........... 327/295
6,653,890 B1 * 11/2003 Ono et al. .................. 327/537
6,774,705 B1 * 8/2004 Miyazaki et al. ........... 327/534

FOREIGN PATENT DOCUMENTS

JP    62272619 A    * 11/1987

OTHER PUBLICATIONS

Kurd, Nasser, et al., "Multi-GHz Clocking Scheme for Intel Pentium 4 Microprocessor", *IEEE International Solid-State Circuits Conference, Session 25, Clock Generation and Distribution,* 25.7, (Feb. 7, 2001), 8 pgs.

Rusu, Stefan, et al., "Clock Generation and Distribution for the First IA-64 Microprocessor", *IEEE International Solid-State Circuits Conference, Session 10, Clock Generation and Distribution, Paper TA 10.6,* (Feb. 8, 2000), 176-177.

Tschanz, James, et al., "Adaptive Body Bias for Reducing Impacts of Die-to-Die and Within-Die Parameter Variations on Microprocessor Frequency and Leakage", *IEEE Journal of Solid-State Circuits,* vol. 37, No. 11, (Nov. 2002), 1396-1402.

* cited by examiner

*Primary Examiner*—Quan Tra
(74) *Attorney, Agent, or Firm*—LeMoine Patent Services, PLLC

(57) ABSTRACT

Transistor bodies are biased to modify delay in clock buffers.

23 Claims, 10 Drawing Sheets

ADAPTIVE BODY BIAS FOR CLOCK SKEW COMPENSATION

FIELD

The present invention relates generally to electronic circuits, and more specifically to clock signals in electronic circuits.

BACKGROUND

Clock signals may be used to time the transfer of data between storage elements in an integrated circuit or system. When clock signals at various elements do not match in time, then "clock skew" is said to exist, or alternatively, the clock signals are described as "skewed." As clock signal frequencies in digital circuits increase, clock skew consumes more of the usable clock cycle.

DESCRIPTION OF EMBODIMENTS

Figure 1:
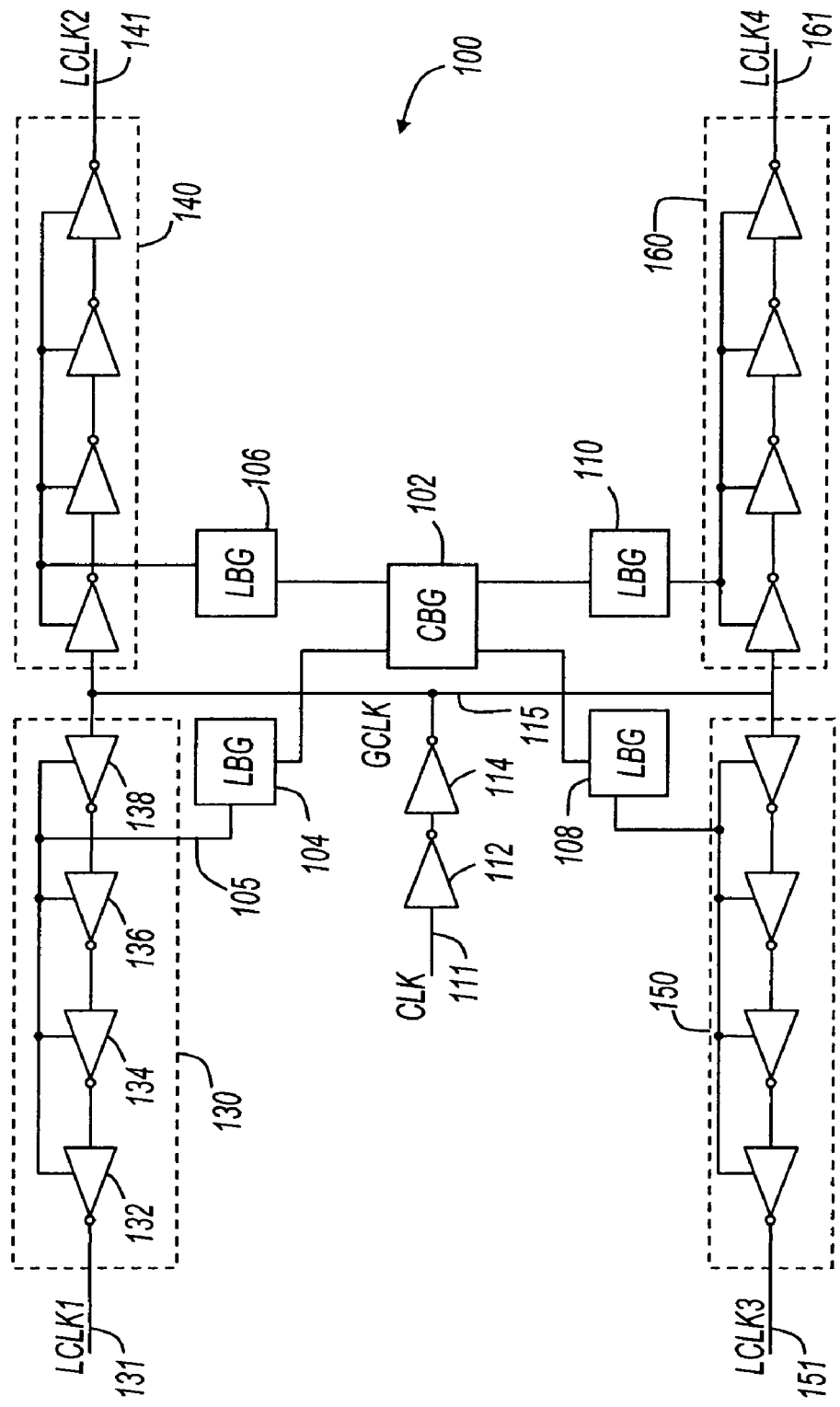
FIG. 1 shows a diagram of a clock distribution system.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein in connection with one embodiment may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

FIG. 1 shows a diagram of a clock distribution system. Clock distribution system 100 includes central bias generator (CBG) 102, local bias generators (LBGs) 104, 106, 108, and 110, clock buffers 112 and 114, and local clock networks 130, 140, 150, and 160. In operation, a clock signal (CLK) is received on node 111 and buffered by clock buffers 112 and 114 to provide a global clock signal (GCLK) on node 115. The global clock signal is provided to local clock networks 130, 140, 150, and 160, which produce local clocks LCLK1, LCLK2, LCLK3, and LCLK4 on nodes 131, 141, 151, and 161, respectively.

Each of the local clock networks shown in FIG. 1 includes one or more variable clock buffers. For example, local clock network 130 includes variable clock buffers 132, 134, 136, and 138. Each of the variable clock buffers receives one or more bias voltages to influence the amount of delay provided by the buffer. For example, each of variable clock buffers 132, 134, 136, and 138 receive one or more bias voltages on node 105 from LBG 104. Similarly, variable clock buffers in local clock networks 140, 150, and 160 receive one or more bias voltages from LBGs 106, 108, and 110, respectively.

As shown in FIG. 1, CBG 102 generates reference voltages, and provides them to several LBGs. The LBGs then provide one or more bias voltages to variable clock buffers in the various clock networks. As used herein, the term "bias voltage distribution network" refers to CBG 102, the various LBGs, any routing resources for reference voltages and bias voltages, and any control circuitry that supports the other circuits in the bias voltage distribution network. In some embodiments, the bias voltage distribution network includes more or less than that shown in FIG. 1. For example, in some embodiments, the bias voltage distribution network does not include any LBGs, and CBG 102 provides bias voltages directly to the various clock networks. Also for example, in some embodiments, the bias voltage distribution network includes circuits in addition to those shown in FIG. 1.

In some embodiments, the variable clock buffers shown in FIG. 1 exhibit variable delay based on the value of bias voltages received. For example, the delay between GCLK and LCLK1 may change based on the values of one or more bias voltages on node 105. In some embodiments, bias voltages on node 105 are applied to transistor bodies in variable clock buffers 132, 134, 136, and 138. In some embodiments, the various clock buffers include isolated gate transistors such as metal oxide semiconductor field effect transistors (MOSFETs). In these embodiments, the body(ies) of either or both of a P-type MOSFET (PMOS) or N-type MOSFET (NMOS) may be coupled to circuit nodes having bias voltages. Various embodiments of variable clock buffers are described in more detail below with reference to FIGS. 2–4.

Central bias generator 102 may generate many different reference voltages, to provide various amounts of clock signal delay at various resolutions. In some embodiments, CBG 102 may provide multiple reference voltages to each LBG, which then select one or more reference voltages to provide as bias voltages to a local clock network. In these embodiments, each LBG may include one or more multiplexers and buffers. In other embodiments, CBG 102 may generate multiple reference voltages, and may also include one or more multiplexers to select the appropriate bias voltage(s) for each local clock network in order to achieve the desired clock skew. Various embodiments of central bias generators are described with reference to FIG. 5, below.

In some embodiments, LBGs include voltage buffers to buffer reference voltages received from CBG 102. In other embodiments, LBGs include circuitry to generate bias voltages from reference voltages received from CBG 102. For example, in some embodiments, LBGs may generate voltages to provide forward body biasing (FBB) and reverse body biasing (RBB). In some of these embodiments, LBGs may produce voltages that are above or below power supply voltages used to provide power to the various clock buffers. Embodiments that employ both FBB and RBB generally have a wider range of delay adjustment, but the bias voltage distribution network implementation may be more complex.

Embodiments that employ FBB without RBB are generally simpler to implement, and may occupy less area on an integrated circuit.

In some embodiments, the operation of CBG 102 and LBGs 104, 106, 108, and 110 is controlled by digital information held in registers (not shown). For example, in some embodiments, a serial scan chain of registers may hold information used to control the generation of various bias voltages. Also for example, in some embodiments, memory mapped registers may hold information used to control the generation of various bias voltages. In other embodiments, fusible links are utilized to set digital bits that control the various bias voltages.

In some embodiments, bias voltages are modified using registers or fuses, resulting in differing amounts of clock skew in different clock domains until a desired operating frequency is obtained. For example, in some embodiments, clock distribution system 100 may reside in a microprocessor. During testing of the microprocessor, the various bias voltages may be modified until a maximum operating frequency is found. In other embodiments, clock distribution system 100 may reside in circuits other than a microprocessor, and the target operating frequency may be other than the maximum operating frequency.

Four local clock networks are shown in FIG. 1. In some embodiments, many more than four local clock networks exist. For example, clock distribution system 100 may be part of an integrated with tens, hundreds, or thousands of local clock networks. The number of local clock networks provided in clock distribution system 100 is not a limitation of the present invention. Further, the number and type of variable clock buffers in a local clock network is not a limitation of the present invention. For example, four variable clock buffers are shown in each local clock network in FIG. 1. In some embodiments, more or less than four variable clock buffers are provided in each local clock network. In some embodiments, various variable clock buffers are sized and/or loaded differently to provide differing amounts of variable delay. Some buffers may provide a coarse delay adjustment and other buffers may provide a fine adjustment. In still further embodiments, local clock networks route different bias voltages to different variable clock buffers, and the delay of the different clock buffers may be individually selectable.

As described above, clock distribution system 100 may be in a single integrated circuit. In some embodiments, clock distribution system 100 is distributed across multiple integrated circuits. For example, in some embodiments, each of local clock networks 130, 140, 150, and 160 may be in separate integrated circuits, and the bias voltage distribution network may be distributed across multiple integrated circuits. In some embodiments, the various integrated circuits may be on a multi-chip module or other highly integrated package.

Figure 4:
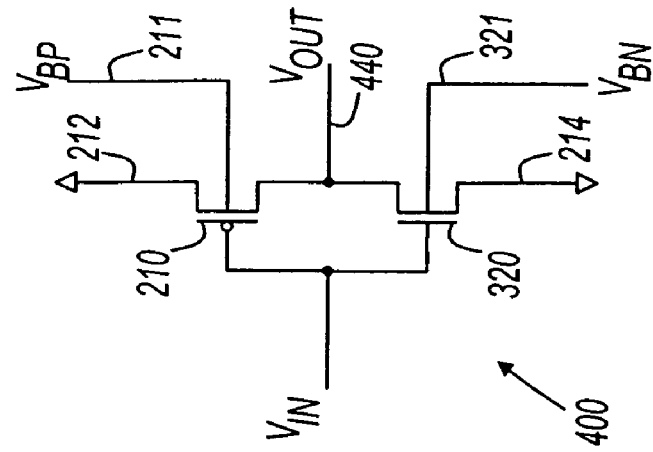
FIGS. 2–4 show clock buffer circuits.
Figure 3:
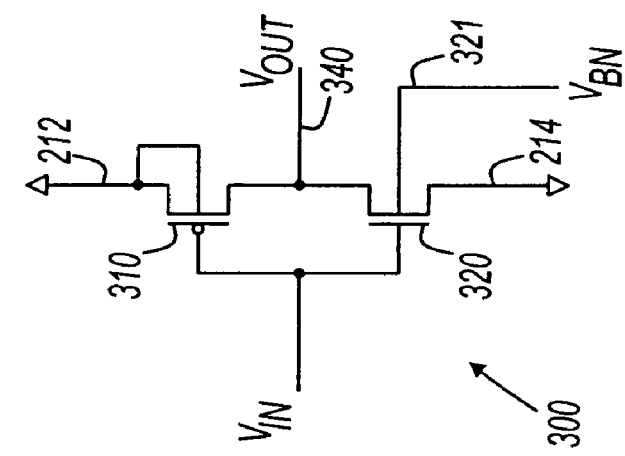
Figure 2:
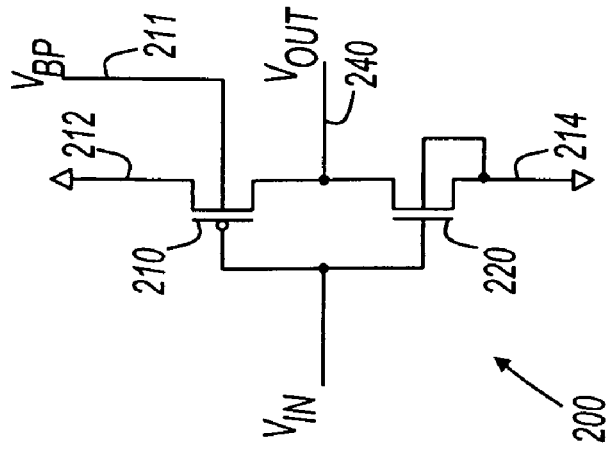

FIGS. 2–4 show variable clock buffers. Variable clock buffers 200, 300, and 400 may be used for any of the clock buffers shown in FIG. 1. For example, in some embodiments, variable clock buffer 200 is used for one or more of variable clock buffers 132, 134, 136, and 138. Also for example, variable clock buffers 300 or 400 may be used for one or more of variable clock buffers 132, 134, 136, and 138. Further, any of the disclosed variable clock buffer embodiments may be used in any combination in a clock distribution system such as clock distribution system 100 (FIG. 1).

Referring now to FIG. 2, variable clock buffer 200 includes PMOS transistor 210 and NMOS transistor 220. PMOS transistor 210 is coupled source-to-drain between upper power supply node 212 and output node 240, and NMOS transistor 220 is coupled drain-to-source between output node 240 and lower power supply node 214. The body of PMOS transistor 210 is coupled to node 211, and the body of NMOS transistor 220 is coupled to lower power supply node 214. Node 211 is shown having a bias voltage $V_{BP}$. In some embodiments, $V_{BP}$ is a bias voltage provided by a local bias generator such as LBG 104 (FIG. 1).

In some embodiments, $V_{BP}$ is a voltage lower than the power supply voltage present on upper power supply node 212. In these embodiments, PMOS transistor 210 is forward body biased (FBB) and the delay of variable clock buffer 200 is reduced. Further, in some embodiments, $V_{BP}$ is a voltage higher than the power supply voltage present on upper power supply node 212. In these embodiments, PMOS transistor 210 is reverse body biased (RBB), and the delay of variable clock buffer 200 is increased.

In some embodiments, the body of PMOS transistor 210 is biased by applying $V_{BP}$ to an N-well within which PMOS transistor 210 is fabricated. N-wells may be a feature of a particular manufacturing process. Any type of manufacturing process that allows body biasing may be utilized without departing from the scope of the present invention.

Referring now to FIG. 3, variable clock buffer 300 includes PMOS transistor 310 and NMOS transistor 320. PMOS transistor 310 is coupled source-to-drain between upper power supply node 212 and output node 340, and NMOS transistor 320 is coupled drain-to-source between output node 340 and lower power supply node 214. The body of PMOS transistor 310 is coupled to upper power supply node 212, and the body of NMOS transistor 320 is coupled to node 321. Node 321 is shown having a bias voltage $V_{BN}$. In some embodiments, $V_{BN}$ is a bias voltage provided by a local bias generator such as LBG 104 (FIG. 1).

In some embodiments, $V_{BN}$ is a voltage higher than the power supply voltage present on lower power supply node 214. In these embodiments, NMOS transistor 320 is forward body biased (FBB) and the delay of variable clock buffer 300 is reduced. Further, in some embodiments, $V_{BN}$ is a voltage lower than the power supply voltage present on lower power supply node 214. In these embodiments, NMOS transistor 320 is reverse body biased (RBB), and the delay of variable clock buffer 300 is increased.

In some embodiments, the body of NMOS transistor 320 is biased by applying $V_{BN}$ to a P-well within which NMOS transistor 320 is fabricated. P-wells may be a feature of a particular manufacturing process, such as a triple-well process. Any type of manufacturing process that allows body biasing may be utilized without departing from the scope of the present invention.

Referring now to FIG. 4, variable clock buffer 400 includes PMOS transistor 210 and NMOS transistor 320. PMOS transistor 210 is coupled source-to-drain between upper power supply node 212 and output node 440, and NMOS transistor 320 is coupled drain-to-source between output node 440 and lower power supply node 214. The body of PMOS transistor 210 is coupled to node 211, and the body of NMOS transistor 320 is coupled to node 321. Node 211 is shown having a bias voltage of $V_{BP}$, and node 321 is shown having a bias voltage of $V_{BN}$. In some embodiments, $V_{BP}$ and $V_{BN}$ are bias voltages provided by a local bias generator such as LBG 104 (FIG. 1).

As described above with reference to FIGS. 2 and 3, either or both of transistors 210 and 320 may be forward body biased or reverse body biased. The delay of variable clock buffer 400 may be modified by changing the value of bias voltages $V_{BP}$ and $V_{BN}$.

Figure 5:
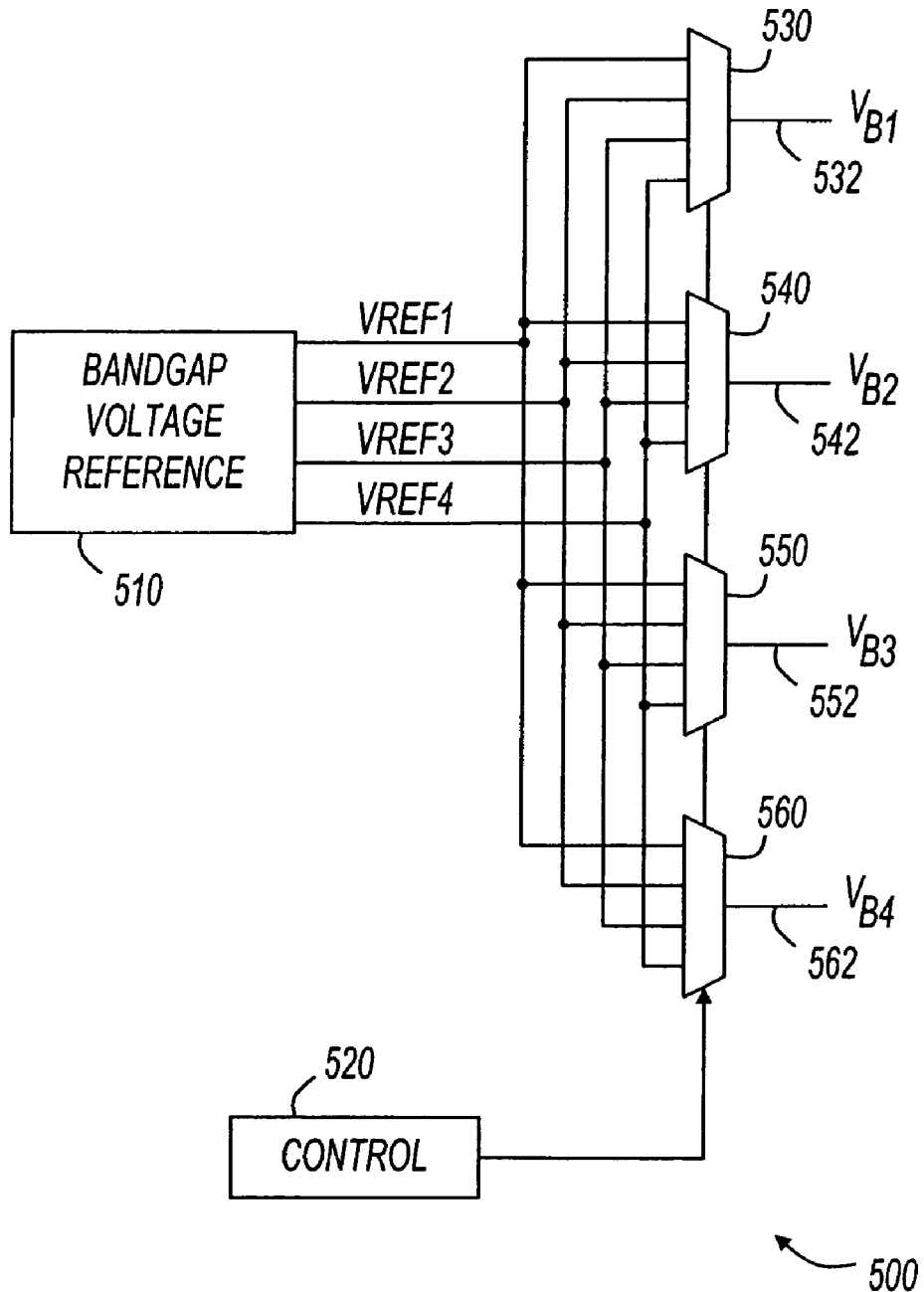
FIG. 5 shows a diagram of a central bias generator.

FIG. 5 shows a diagram of a central bias generator. Central bias generator 500 represents various embodiments of central bias generators that may be utilized in clock distribution systems. For example, central bias generator 500 may be utilized for CBG 102 in clock distribution system 100 (FIG. 1). Central bias generator 500 may also be utilized as a CBG in a clock distribution system represented by figures that follow. Central bias generator 500 includes bandgap voltage reference 510, multiplexers 530, 540, 550, and 560, and control mechanism 520.

As shown in FIG. 5, bandgap voltage reference 510 generates multiple reference voltages which are in some embodiments, process, voltage, and temperature-independent. The number of reference voltages generated by bandgap voltage reference 510 may be determined by a number of factors, including the resolution and range of desired delay in the clock distribution system. In embodiments represented by FIG. 5, multiplexers 530, 540, 550, and 560 are used to select one of the reference voltages to route to the LBG for each local clock network. In some embodiments, the number of multiplexers may be the same as the number of clock networks that can be individually controlled.

Control mechanism 520 provides an interface to CBG 500 so that it may be controlled through various methods, including, but not limited to, scan chains, fuse bits, or other external methods. In some embodiments, control mechanism 520 receives one or more signals (not shown) from external sources. These signals may influence control mechanism 520 to modify the control signals provided to the various multiplexers, and to change the voltage values $V_{B1}$, $V_{B2}$, $V_{B3}$, and $V_{B4}$.

As shown in FIG. 5, each of multiplexers 530, 540, 550, and 560 provide a single bias voltage. For example, multiplexer 530 provides $V_{B1}$ on node 532, multiplexer 540 provides $V_{B2}$ on node 542, multiplexer 550 provides $V_{B3}$ on node 552, and multiplexer 560 provides $V_{B4}$ on node 562. The various voltages driven by the multiplexers may be reference voltages to be sent to LBGs for buffering and distribution to local clock networks, or may be bias voltages that are to be coupled directly to transistor bodies of variable clock buffers. For example, in some embodiments, $V_{B1}$ is a voltage to bias the body of a PMOS transistor such as PMOS transistor 210 (FIG. 2). Also for example, in some embodiments, $V_{B1}$ is a voltage to bias the body of an NMOS transistor such as NMOS transistor 320 (FIG. 3). Some embodiments may include separate multiplexers to provide bias voltages for PMOS transistors and NMOS transistors.

Although four reference voltages and four multiplexers are shown in FIG. 5, this is not a limitation of the present invention. For example, in some embodiments, many more voltages and many more multiplexers are present. In some embodiments, multiplexers 530, 540, 550, and 560 are omitted from CBG 500. In these embodiments, the multiplexers may be included in LBGs, or may be omitted completely. For example, in some embodiments, CBG 500 includes a voltage reference circuit such as bandgap voltage reference 510, and LBGs include multiplexers to select bias voltages from reference voltages.

Figure 6:
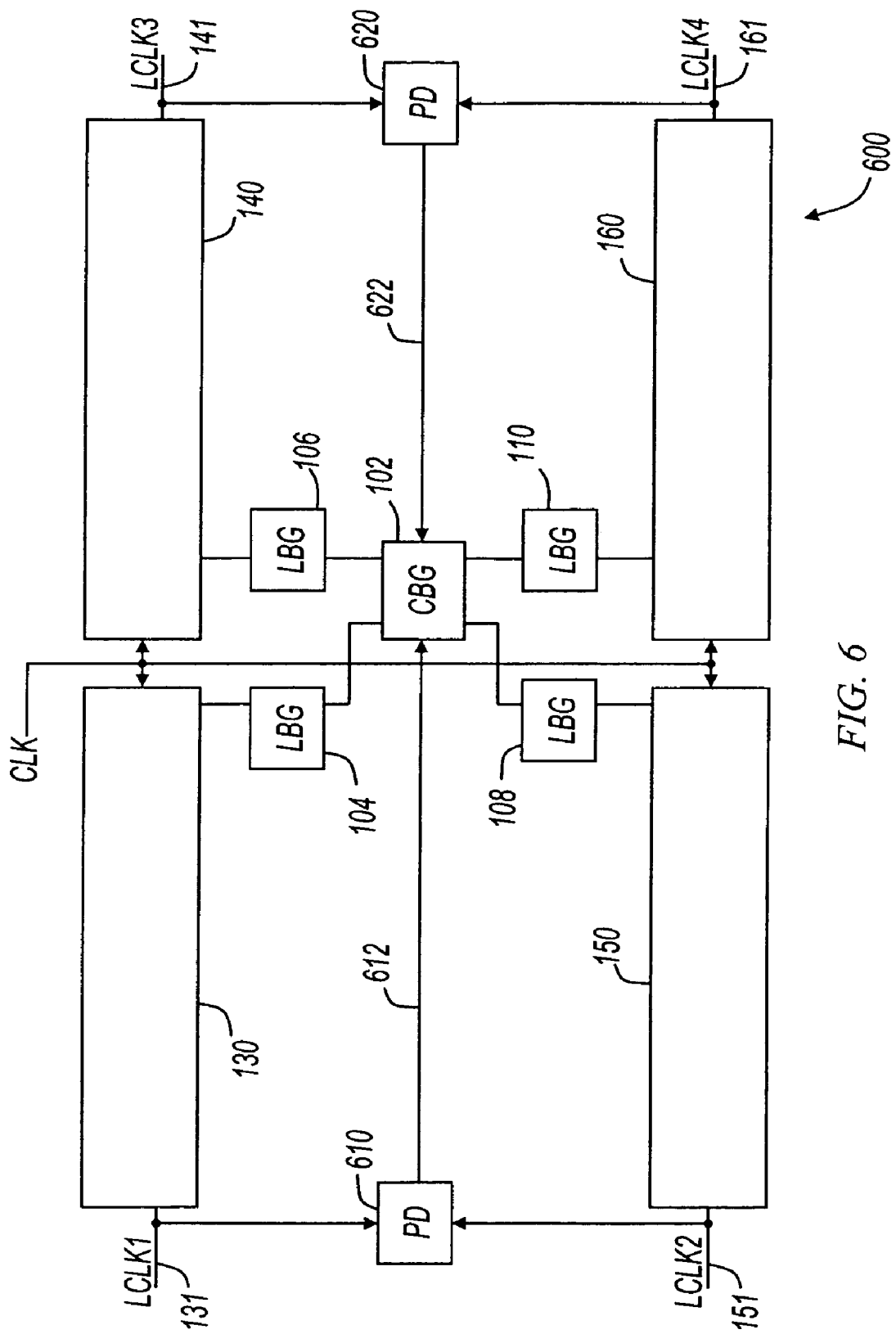
FIGS. 6–10 show block diagrams of adaptive clock distribution systems.

FIGS. 6–10 show block diagrams of adaptive clock distribution systems. Referring now to FIG. 6, clock distribution system 600 includes the elements of clock distribution system 100 (FIG. 1), and also includes phase detectors 610 and 620.

Phase detectors 610 and 620 are examples of comparison circuits that are coupled to form feedback loops that provide for adaptive clock skew compensation. In some embodiments, each phase detector compares the arrival times of the local clocks in two physically adjacent domains. In other embodiments, each phase detector compares arrival times of local clocks in non-adjacent domains. In some embodiments, the output of the phase detector may be a "lead/lag" signal which indicates the order in which the two local clocks arrive, and in other embodiments, the output of the phase detector may be an error signal with a variable voltage to indicate the amount of phase difference between arriving signals. For example, if local clock LCLK3 arrives at phase detector 620 earlier than local clock LCLK4, the output of phase detector 620 may indicate to CBG 102 that LCLK3 is leading LCLK4. Central bias generator 102 may then adjust the reference signals to LBG 106, LBG 110, or both, and LBGs 106 and 110 may then change the body bias applied to variable clock buffers in either or both of local clock networks 140 and 160. For example, more forward bias may be applied to variable clock buffers in local clock network 160, or less forward bias may be applied to variable clock buffers in local clock network 140.

Feedback loops may continue to adjust bias values until the two clock edges align. In some embodiments, phase detectors 610 and 620 are able to detect the condition where the two inputs are sufficiently close together, and signal to CBG 102 that the bias levels should not be changed. In some of these embodiments, clock skew compensation may happen automatically and dynamically, without requiring external control.

Although two phase detectors are shown in FIG. 6, this is not a limitation of the present invention. For example, any number of phase detectors may exist, and local clock signals from local clock networks may be routed to any number of phase detectors.

Figure 7:
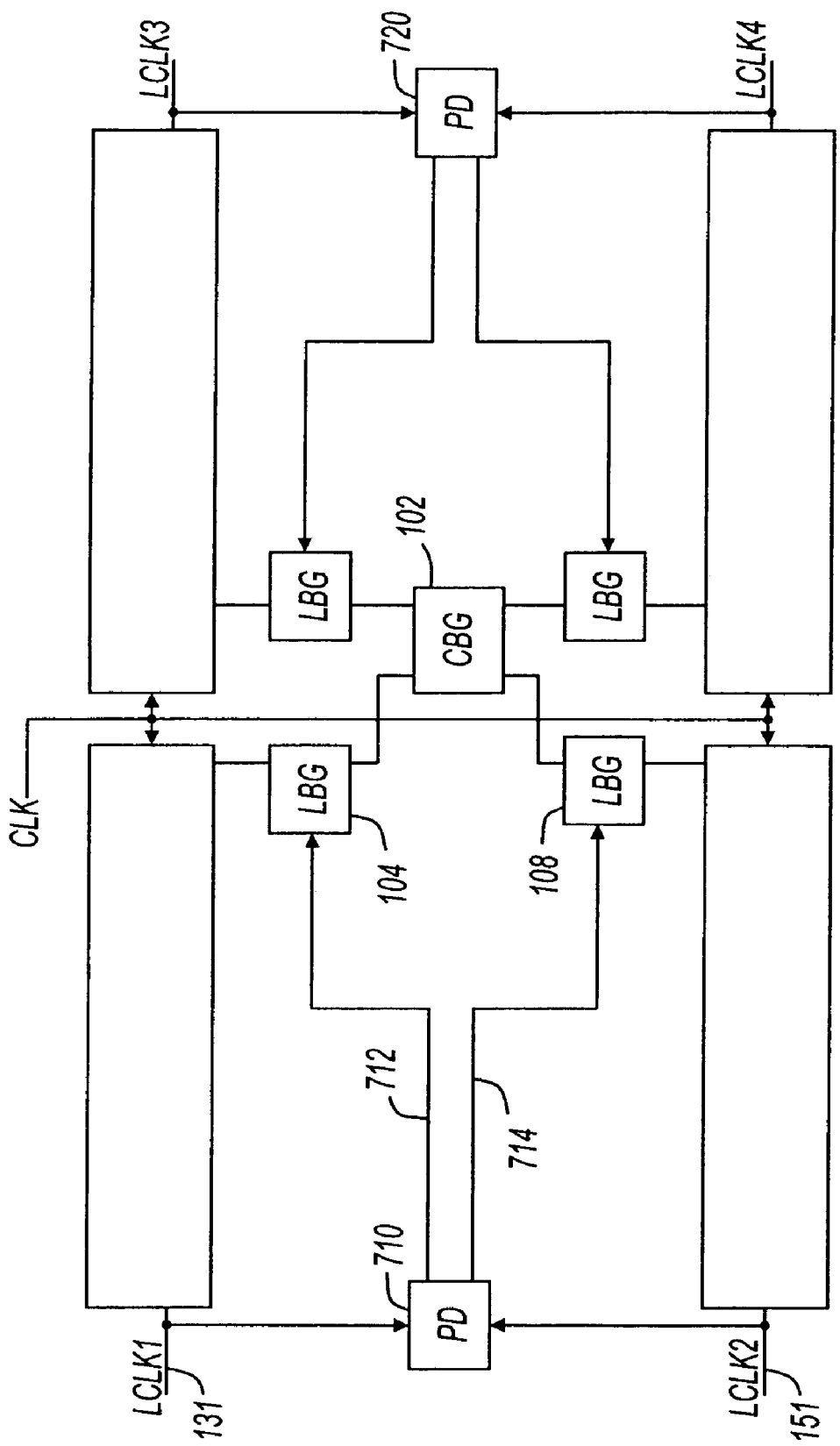

Referring now to FIG. 7, phase detectors 710 and 720 measure phase differences between local clock signals and provide signals to local bias generators. For example, phase detector 710 compares the phase of local clock signals LCLK1 and LCLK2 on nodes 131 and 151, and produces signals on nodes 712 and 714. In response to the signal on node 712, LBG 104 may alter one or more bias voltages provided to local clock network 130, and in response to the signal on node 714, LBG 108 may alter one or more bias voltages provided to local clock network 150.

In some embodiments, the various local bias generators may include linear amplifiers to amplify reference voltages from central bias generator 102 based on control signals received from phase detectors. In other embodiments, each local bias generator receives multiple reference voltages from CBG 102, and selects from the reference voltages based on signals from phase detectors.

Figure 8:
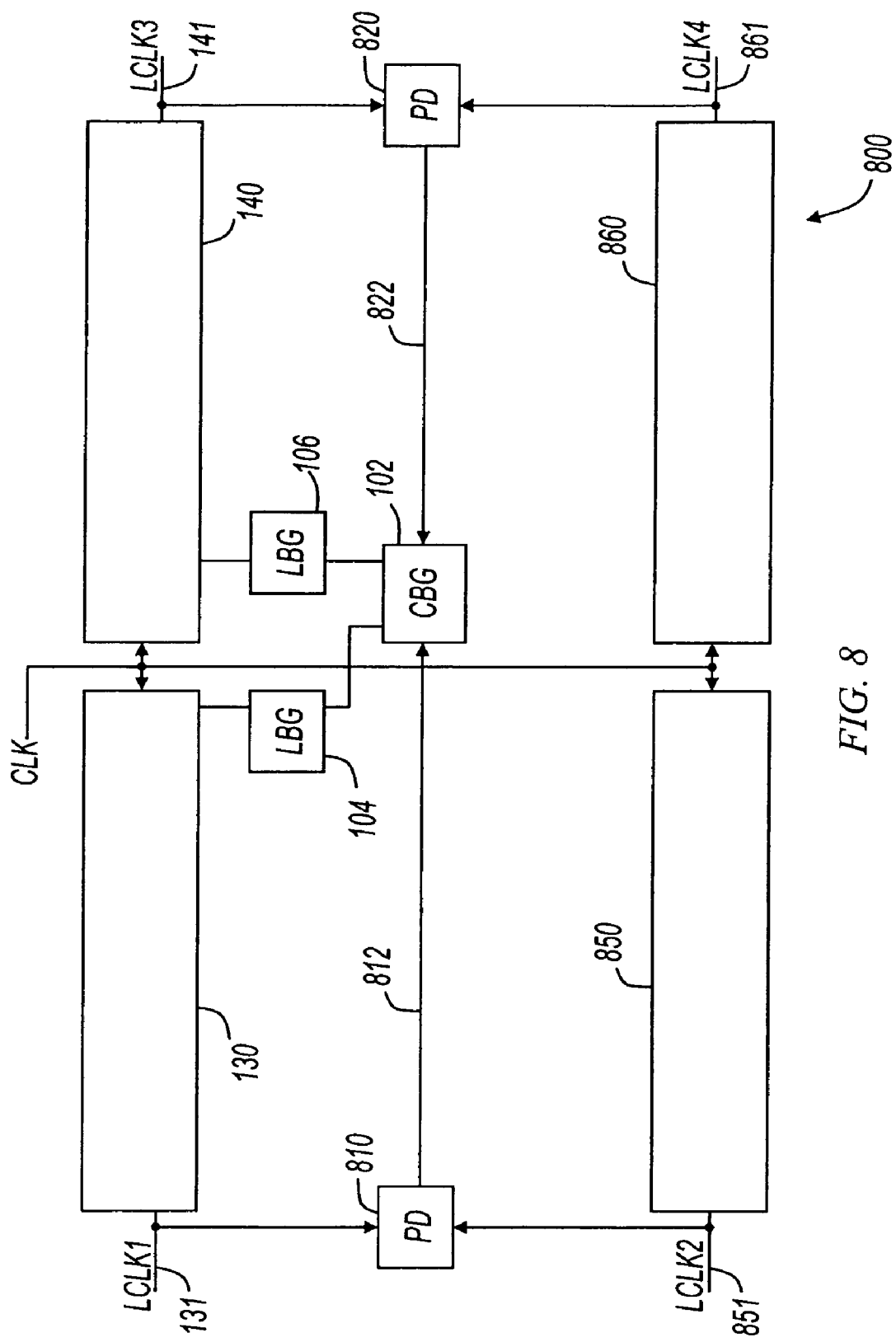

Referring now to FIG. 8, clock distribution system 800 includes local clock networks 130 and 140, and also includes local clock networks 850 and 860. As described with reference to the previous figures, local clock networks 130 and 140 include variable clock buffers, and receive one or more bias voltages from a bias voltage distribution network. Local clock networks 850 and 860 receive the clock signal and produce local clock signals, but do not have variable delay based on body biased transistors.

In embodiments represented by FIG. 8, some local clock networks do not have adjustable delay, and some local clock networks do have adjustable delay. In some embodiments, local clock signals output from adjustable clock networks are compared with local clock signals output from nonadjustable clock networks. For example, phase detector 810 may compare the phase of local clock signals LCLK1 and LCLK2 on nodes 131 and 851, and produce a signal on node 812. In response to the signal on node 812, CBG 102 may alter reference voltages provided to LBG 104, to reduce the phase difference as measured by phase detector 810. Also for example, phase detector 820 may compare the phase of local clock signals LCLK3 and LCLK4 on nodes 141 and 861, and produce a signal on node 822. In response to the signal on node 822, CBG 102 may alter reference voltages provided to LBG 106, to reduce the phase difference as measured by phase detector 810.

Figure 9:
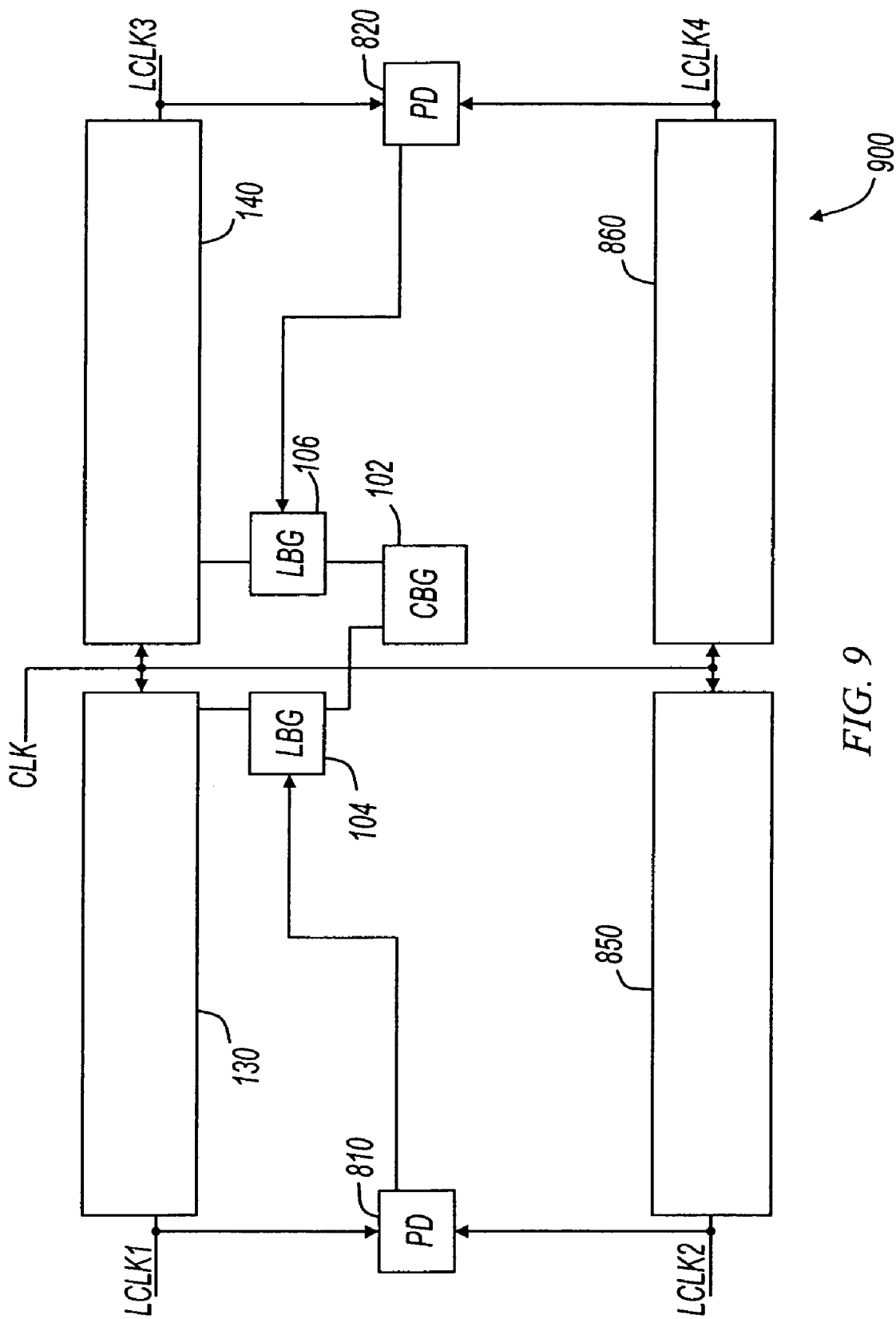

Referring now to FIG. 9, clock distribution system 900 includes the same elements as clock distribution system 800 (FIG. 8), however, rather than the phase detectors providing signals to CBG 102, the phase detectors provide signals to LBGs 104 and 106.

Figure 10:
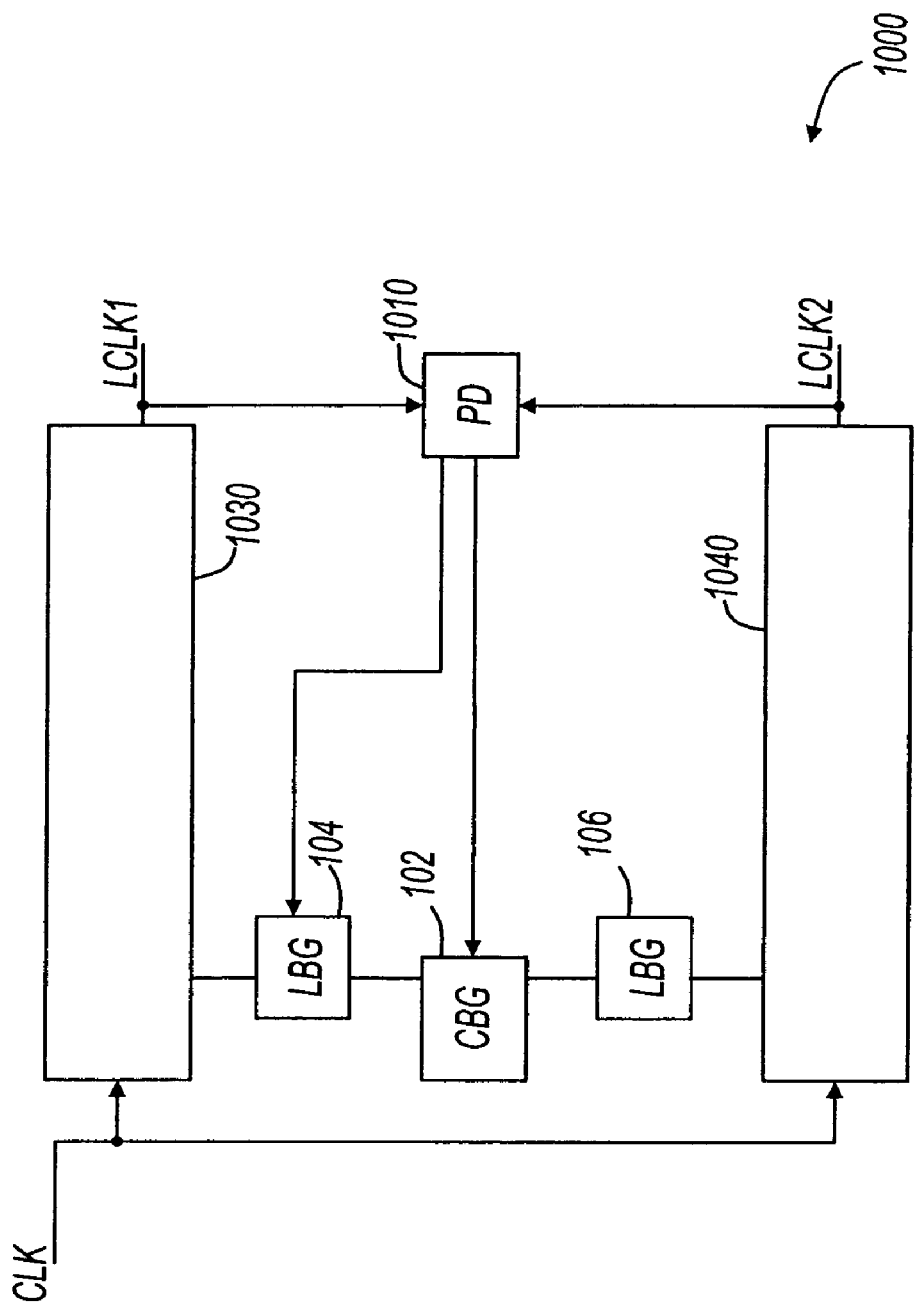

Referring now to FIG. 10, clock distribution system 1000 includes local clock networks 1030 and 1040, phase detector 1010, CBG 102, and LBGs 104 and 106. In embodiments represented by FIG. 10, phase detector 1010 provides signals to both the central bias generator as well as one or more local bias generators. In some embodiments, CBG 102 provides a coarse adjustment by providing a different reference voltage, and LBG 104 provides a fine adjustment by amplifying the reference voltage to produce one or more bias voltages.

Figure 11:
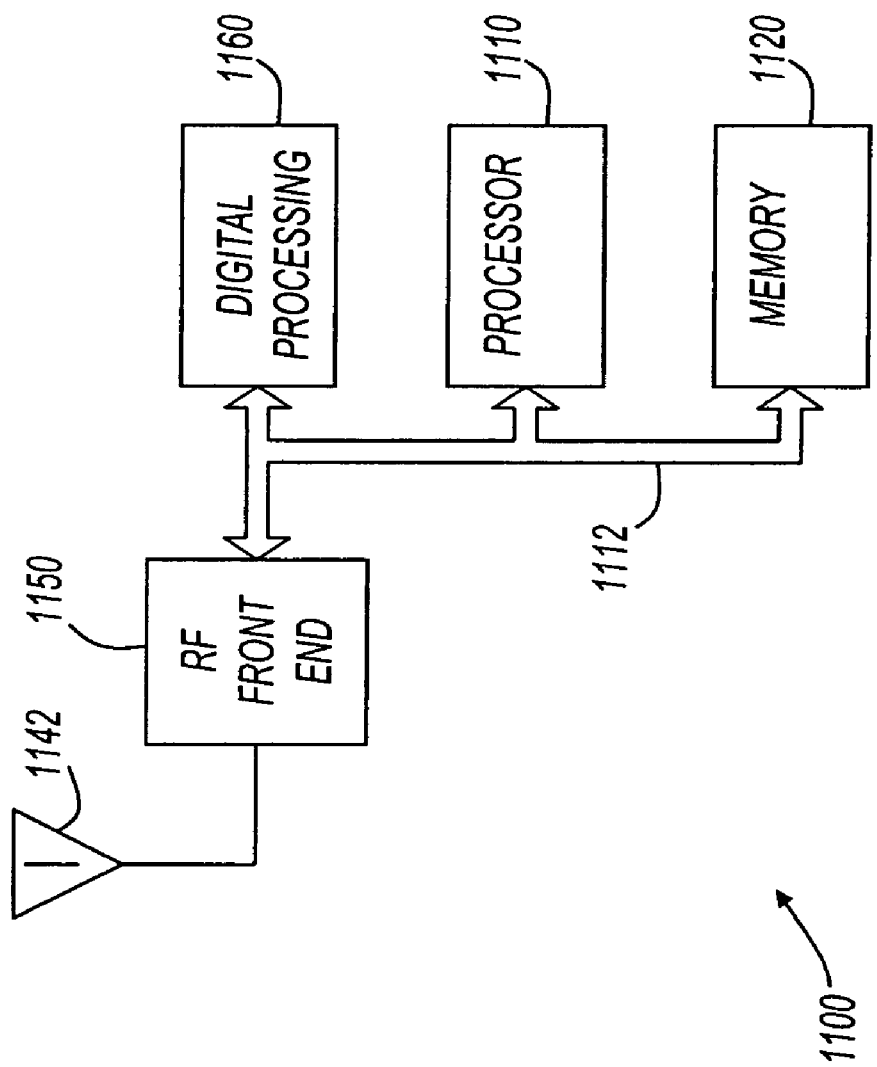
FIG. 11 shows a block diagram of an electronic system in accordance with various embodiments of the present invention.

FIG. 11 shows a block diagram of an electronic system in accordance with various embodiments of the present invention. System 1100 includes antenna 1142, RF front end 1150, digital processing block 1160, processor 1110, and memory 1120. Antenna 1142 may be either a directional antenna or an omni-directional antenna. For example, in some embodiments, antenna 1142 may be an omni-directional antenna such as a dipole antenna, or a quarter-wave antenna. Also for example, in some embodiments, antenna 1142 may be a directional antenna such as a parabolic dish antenna or a Yagi antenna.

Any of the blocks depicted in FIG. 11 may include one or more of the clock distribution embodiments described with reference to the previous figures. For example, digital processing block 1160 or processor 1110 may include one or more integrated circuits that incorporate an adaptive clock skew compensation circuit that utilizes body biasing of transistors to modify variable clock buffer delay values.

In some embodiments, signals transmitted or received by antenna 1142 may correspond to voice signals, data signals, or any combination thereof. For example, either or both of RF front end 1150 and digital processing block 1160 may include the appropriate circuitry to implement a wireless local area network interface, cellular phone interface, global positioning system (GPS) interface, or the like.

Radio frequency (RF) front end 1150 receives RF signals from antenna 1142 and in various embodiments, performs varying amounts and types of signal processing. For example, in some embodiments, RF front end 1150 may include oscillators, mixers, filters, demodulators, detectors, decoders, or the like. Also for example, RF front end 1150 may perform signal processing such as frequency conversion, carrier recovery, symbol demodulation, or any other suitable signal processing.

Digital processing block 1160 receives a signal from RF front end 1150, and performs various amounts and types of digital processing. For example, digital processing block 1160 may perform de-interleaving, decoding, error recovery, or the like. As described above, digital processing block 1160 may include the appropriate circuitry to implement any type of communications system, including but not limited to, wireless networking, cellular telephony, and satellite signal reception. The various embodiments of the present invention are not limited by the many possible physical implementations of digital processing block 1160.

The various blocks shown in FIG. 11 are coupled by bus 1112. Bus 1112 may be any type of bus including any number of conductors. For example, bus 1112 may be any type of communications interface, including but not limited to, a serial interface, a parallel interface, a processor bus, a system bus, or the like.

In some embodiments, processor 1110 may be any suitable processor to influence the operation of other circuits such as digital processing block 1160 and RF front end 1150. In some embodiments, processor 1110 may perform operations in support of method embodiments of the present invention. Processor 1110 represents any type of processor, including but not limited to, a microprocessor, a microcontroller, a digital signal processor, a personal computer, a workstation, or the like. Further, processor 1110 may be formed of dedicated hardware, such as state machines or the like.

Memory 1120 represents an article that includes a machine readable medium. For example, memory 1120 represents any one or more of the following: a hard disk, a floppy disk, random access memory (RAM), dynamic random access memory (DRAM), static random access memory (SRAM), read only memory (ROM), flash memory, CDROM, or any other type of article that includes a medium readable by a machine such as processor 1110. In some embodiments, memory 420 can store instructions for performing the execution of the various method embodiments of the present invention.

In operation of some embodiments, processor 1110 reads instructions and data from memory 1120 and performs actions in response thereto. For example, various method embodiments of the present invention may be performed by processor 1110 while reading instructions from memory 1120.

Electronic systems, clock distribution systems, bias voltage distribution networks, variable clock buffers, and other embodiments of the present invention can be implemented in many ways. In some embodiments, they are implemented in integrated circuits. In some embodiments, design descriptions of the various embodiments of the present invention are included in libraries that enable designers to include them in custom or semi-custom designs. For example, any of the disclosed embodiments can be implemented in a synthesizable hardware design language, such as VHDL or Verilog, and distributed to designers for inclusion in standard cell designs, gate arrays, or the like. Likewise, any embodiment of the present invention can also be represented as a hard macro targeted to a specific manufacturing process. For example, any of the bias generator embodiments described herein may be represented as polygons assigned to layers of an integrated circuit.

Figure 12:
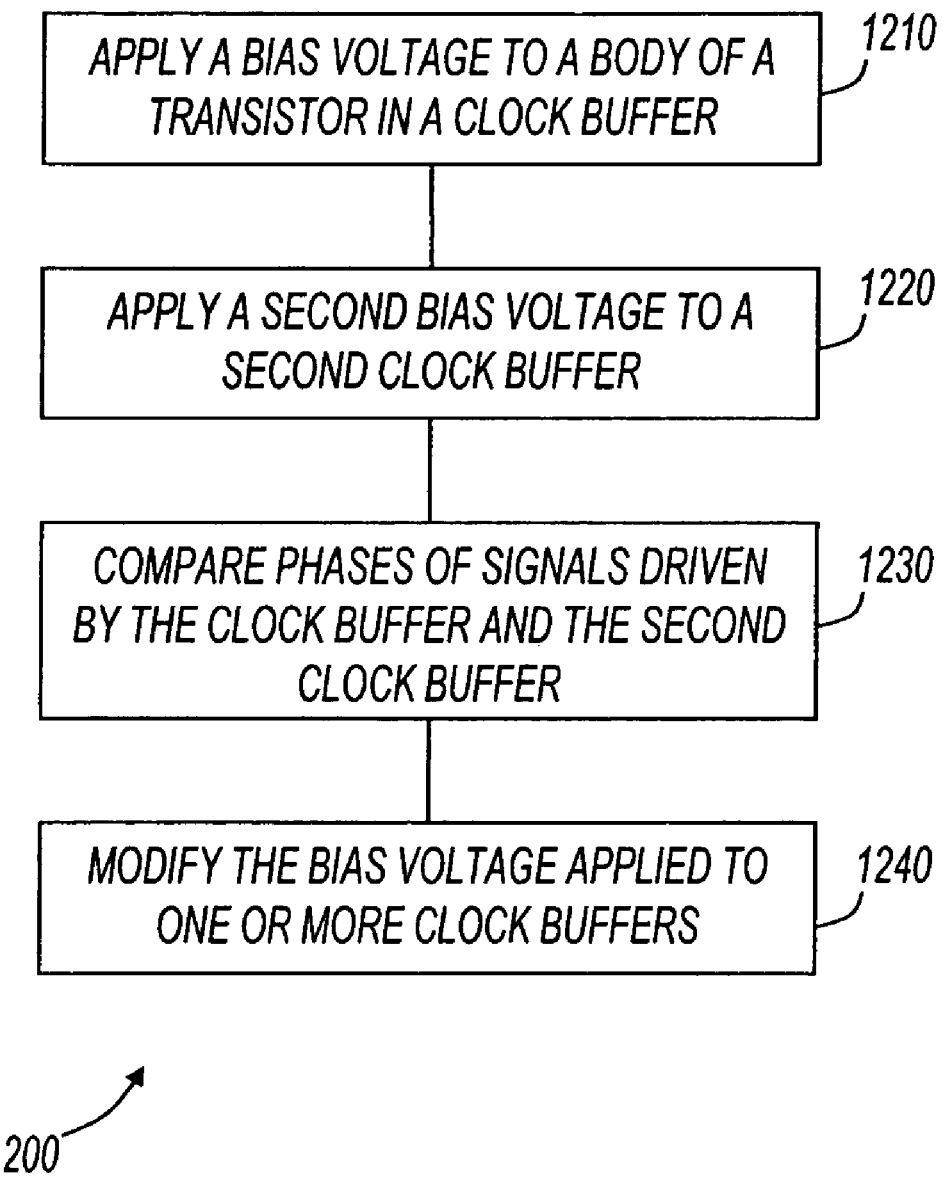
FIG. 12 shows a flowchart in accordance with various embodiments of the present invention.

FIG. 12 shows a flowchart in accordance with various embodiments of the present invention. In some embodiments, method 1200, or portions thereof, is performed by an electronic system, a clock distribution system, an integrated circuit, or a bias voltage distribution network, embodiments of which are shown in the various figures. In other embodiments, all or a portion of method 1200 is performed by a control circuit or processor. Method 1200 is not limited by the particular type of apparatus or software element performing the method. The various actions in method 1200 may be performed in the order presented, or may be performed in a different order. Further, in some embodiments, some actions listed in FIG. 12 are omitted from method 1200.

Method 1200 is shown beginning with block 1210 where a bias voltage is applied to a body of a transistor in a clock buffer. In some embodiments, this may correspond to applying a body bias voltage to the various transistors shown in FIGS. 2, 3, and 4. Bias voltages may be applied by one or more local bias generators or one or more central bias generators. In some embodiments, the clock buffer is part of a local clock network. For example, referring back to FIG. 1, the clock buffer may be one of clock buffers 132, 134, 136, or 138 in local clock network 130.

At 1220, a second bias voltage is applied to a second clock buffer. In some embodiments, this may correspond to applying a body bias voltage to a transistor in a variable clock buffer that is part of a second local clock network. For example, referring now back to FIG. 1, the actions of block 1220 may correspond to providing a bias voltage to a clock buffer in local clock network 150.

At 1230, phases of signals driven by the clock buffer and the second clock buffer are compared. In some embodiments, this may correspond to comparing the time of arrival of two clock signals, and determining which arrives first. In other embodiments, this may correspond to measuring a phase difference between two signals and producing a signal that describes the phase difference. For example, referring now back to FIG. 6, phase detector 610 receives local clock signals LCLK1 and LCLK2, and compares them. In some embodiments, phase detector 610 may provide an indication of which clock signal arrived first, and in other embodiments, phase detector 610 may provide a signal describing the phase difference between LCLK1 and LCLK2.

In some embodiments, block 1230 is omitted from method 1200. For example, in some embodiments, phase detectors resident in clock distribution systems may not be utilized. Also for example, some clock distribution system embodiments do not include phase detectors. Referring now back to FIG. 1, method 1200 may be utilized in conjunction with clock distribution system 100, and block 1230 of method 1200 may be omitted.

At 1240, the bias voltage applied to one or more clock buffers is modified. In some embodiments, the bias voltage is modified in an attempt to reduce the phase difference between the two clock signals. For example, referring now back to FIG. 6, CBG 102 receives a signal on node 612 from phase detector 610, and modifies a bias voltage applied to variable clock buffers in one or more of local clock networks 130 and 150. The actions of block 1240 may be performed in many different ways. For example, the local bias generator may modify a bias voltage, a central bias generator may modify a bias voltage, or any other suitable circuit may modify an applied body bias voltage to change the delay in a clock signal path without departing from the scope of the present invention.

The actions of 1240 may also be performed by modifying digital information in a register, or blowing fuses. For example, clock skew may be modified in clock distribution system 100 (FIG. 1) by modifying digital information that sets bias voltages generated by CBG 102 and/or LBGs 104, 106, 108, and 110. In some of these embodiments, the bias voltages may be modified in an attempt to reach a target operating frequency, and in some embodiments, the target operating frequency may be a maximum operating frequency.

Although the present invention has been described in conjunction with certain embodiments, it is to be understood that modifications and variations may be resorted to without departing from the spirit and scope of the invention as those skilled in the art readily understand. Such modifications and variations are considered to be within the scope of the invention and the appended claims.

What is claimed is:

1. An apparatus comprising:
a bias voltage distribution network comprising a central bias generator to produce at least one reference voltage, and a plurality of local bias generators to receive the at least one reference voltage and produce a plurality of bias voltages;
a plurality of clock buffers having transistor bodies coupled to receive the plurality of bias voltages from the bias voltage distribution network; and
at least one comparison circuit coupled between the plurality of clock buffers and the bias voltage distribution network, wherein the at least one comparison circuit comprises a phase detector to measure a phase difference between signals driven by at least two of the plurality of clock buffers, and to provide an error signal to the bias voltage distribution network;
wherein both the central bias generator and the at least one local bias generator are coupled to receive the error signal.

2. The apparatus of claim 1 wherein the plurality of clock buffers are divided into a plurality of clock networks.

3. The apparatus of claim 2 wherein the plurality of local bias generators comprises a multiplexer.

4. The apparatus of claim 2 wherein the plurality of local bias generators comprises one local bias generator for each clock network.

5. The apparatus of claim 1 wherein the plurality of clock buffers include complementary transistors coupled to upper and lower power supply nodes.

6. The apparatus of claim 5 wherein the central bias generator includes a circuit to produce a reference voltage between an upper power supply voltage on the upper power supply node and a lower power supply voltage on the lower power supply node.

7. The apparatus of claim 5 wherein the central bias generator includes a circuit to produce a reference voltage above an upper power supply voltage on the upper power supply node.

8. The apparatus of claim 5 wherein the central bias generator includes a circuit to produce a reference voltage below a lower power supply voltage on the lower power supply node.

9. An electronic system comprising:
an antenna;
a radio frequency circuit coupled to the antenna; and
a digital circuit coupled to the radio frequency circuit, the digital circuit including variable delay clock buffers, a central bias generator to produce at least one reference voltage, and a local bias generator to receive the at least one reference voltage and produce a bias voltage, the local bias generator being coupled to the variable delay clock buffers, and a comparison circuit to produce an error signal from a comparison of two signals from the variable delay clock buffers, wherein the central bias generator and local bias generator are both coupled to receive the error signal.

10. The electronic system of claim 9 wherein the variable delay clock buffers are formed into a plurality of clock networks having clock delay values set by the bias voltage.

11. The electronic system of claim 9 wherein the variable delay clock buffers include transistor bodies coupled to receive the bias voltage.

12. The electronic system of claim 9 further comprising a plurality of local bias generators.

13. The electronic system of claim 9 wherein the comparison circuit comprises a phase detector.

14. A method comprising:
generating a plurality of bias voltages at a central bias generator;
selecting one of the plurality of bias voltages at a local bias generator to produce a selected bias voltage;
applying the selected bias voltage to a body of a transistor in a clock buffer;
measuring a delay of the clock buffer to produce an error signal;
modifying the plurality of bias voltages in response to the error signal; and
selecting a different one of the plurality of bias voltages in response to the error signal.

15. The method of claim 14 further comprising applying a second bias voltage to a second clock buffer.

16. The method of claim 15 wherein measuring a delay comprises comparing phases of signals driven by the clock buffer and the second clock buffer.

17. An apparatus comprising:
clock buffers with variable delay influenced by body bias;
a bias voltage generation network including a central bias generator to produce at least one reference voltage, and a local bias generator to receive the at least one reference voltage and to influence the delay of the clock buffers; and
an error signal generation circuit to produce an error signal in response to the variable delay in the clock buffers, wherein the central bias generator and local bias generator are coupled to be responsive to an error signal from the error signal generation circuit.

18. The apparatus of claim 17 wherein the clock buffers are arranged to form a plurality of clock networks.

19. The apparatus of claim 18 wherein the error signal generation circuit comprises a phase detector to compare clock signals from at least two of the plurality of clock networks.

20. The apparatus of claim 17 wherein the central bias generator is coupled to produce a plurality of reference voltages in response to the error signal.

21. An apparatus comprising:
clock buffers with variable delay influenced by body bias;
a bias voltage generation network including a central bias generator and a local bias generator; and
an error signal generation circuit to produce an error signal in response to the variable delay in the clock buffers, wherein the central bias generator and local bias generator are coupled to be responsive to an error signal from the error signal generation circuit;
wherein the central bias generator is coupled to produce a plurality of reference voltages in response to the error signal and wherein the local bias generator is coupled to select one of the plurality of bias voltages in response to the error signal.

22. The apparatus of claim 21 wherein the clock buffers are arranged to form a plurality of clock networks.

23. The apparatus of claim 22 wherein the error signal generation circuit comprises a phase detector to compare clock signals from at least two of the plurality of clock networks.

* * * * *